United States Patent [19]
Yoshikawa

[11] Patent Number: 5,491,363
[45] Date of Patent: Feb. 13, 1996

[54] LOW BOILING POINT LIQUID COOLANT COOLING STRUCTURE FOR ELECTRONIC CIRCUIT PACKAGE

[75] Inventor: Minoru Yoshikawa, Tokyo, Japan

[73] Assignee: NEC Corporation, Tokyo, Japan

[21] Appl. No.: 396,900

[22] Filed: Mar. 1, 1995

Related U.S. Application Data

[63] Continuation of Ser. No. 11,775, Feb. 1, 1993, abandoned.

[30] Foreign Application Priority Data

Feb. 10, 1992 [JP] Japan ................................ 4-023052
Jun. 24, 1992 [JP] Japan ................................ 4-165768

[51] Int. Cl.⁶ ............................ H05K 7/20; H01L 23/34; F28F 7/00
[52] U.S. Cl. .................... 257/715; 257/714; 361/689; 361/700; 165/80.4
[58] Field of Search ............................ 257/714, 715, 257/716, 712, 713, 721; 361/688, 689, 690, 698, 699, 700; 165/80.4

[56] References Cited

U.S. PATENT DOCUMENTS

| | | | |
|---|---|---|---|
| 3,649,738 | 3/1972 | Anderson et al. | 165/80.4 |
| 4,392,007 | 7/1983 | Barkats et al. | 165/80.4 |
| 4,866,570 | 9/1989 | Porter | 257/715 |
| 4,896,247 | 1/1990 | Cozer | 361/689 |
| 4,977,444 | 12/1990 | Nakajima et al. | 257/714 |
| 5,021,924 | 6/1991 | Kieda et al. | |

FOREIGN PATENT DOCUMENTS 0341950  11/1989  European Pat. Off.

OTHER PUBLICATIONS

IBM Technical Disclosure Bulletin, vol. 32, No. 8A, Jan. 1990, New York, pp. 168–170.

Primary Examiner—Sara W. Crane
Assistant Examiner—Carl Whitehead, Jr.
Attorney, Agent, or Firm—Sughrue, Mion, Zinn, Macpeak & Seas

[57] ABSTRACT

A cooling structure which is used for forced cooling of an electronic circuit package such as an integrated circuit is disclosed. The cooling structure comprises a tubular fin member having many through-holes of small diameter, a flat plate member which is joined to and seals one end of the tubular fin member, a lid member attached to the other end of the tubular fin member and a pipe member used as a nozzle from which coolant is jetted towards the plate member. Both the tubular fin member and the plate member are made of a material having high heat conductivity. The pipe member extends through the lid member or is inserted through an opening formed in the lid member. The electronic circuit package is fixed to the plate member.

20 Claims, 7 Drawing Sheets

Fig. 10

LOW BOILING POINT LIQUID COOLANT COOLING STRUCTURE FOR ELECTRONIC CIRCUIT PACKAGE

This is a Continuation of application Ser. No. 08/011,775 filed Feb. 1, 1993, now abandoned.

BACKGROUND OF THE INVENTION

1. Field of the Invention

This invention relates to a cooling structure adapted for an electronic circuit package such as an integrated circuit package, and more particularly to a cooling structure which is used to perform forced cooling of an electronic circuit package using coolant.

2. Description of the Related Art

The immersion jet cooling method is one way of cooling an integrated circuit chip which is mounted on a circuit board such as a printed circuit board and generates a high level of heat. In the immersion jet cooling method, the chip is cooled by jetting coolant from a nozzle directly to an integrated circuit chip immersed in electrical insulating liquid or to a heat sink adhered to the heat radiating face of the integrated circuit chip.

Figure 1:
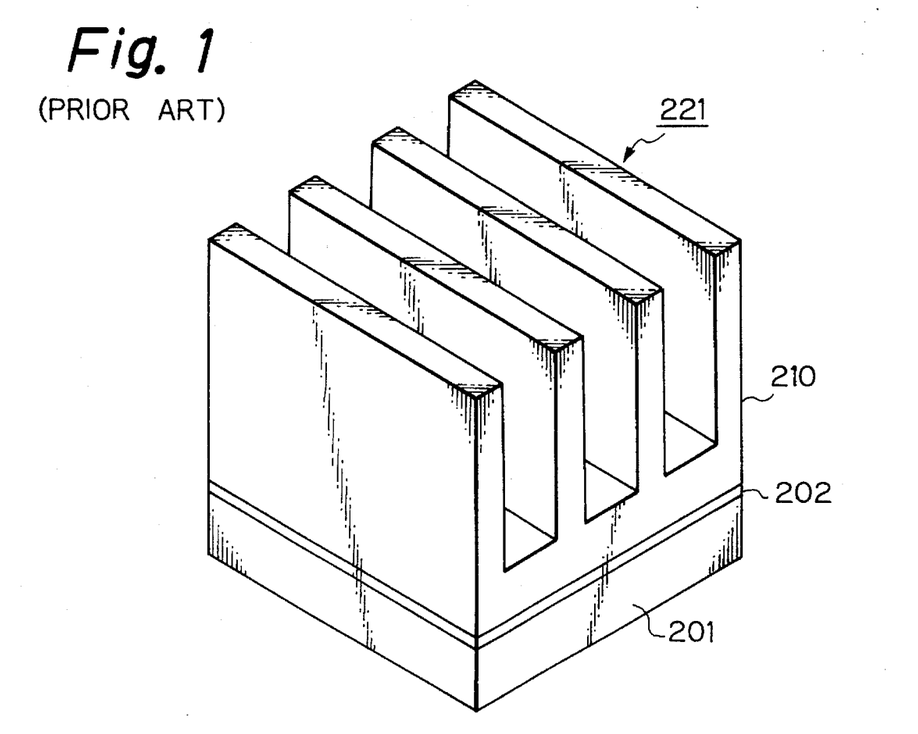
FIG. 1 is a perspective view showing an integrated circuit chip to which a heat sink is adhered.

FIG. 1 shows an integrated circuit chip 201 to which a heat sink 221 is adhered. A plurality of fins 210 are formed on the heat sink 221 which extend vertically upwardly. Here, the pitch of the fins 210 is fixed. The surface of the fins 210 is finished with a smooth face or a rather rough face. The heat sink 221 is adhered to the heat radiating face of the integrated circuit chip 201 by means of a heat conducting bonding member 202. The heat conducting bonding member 202 may be, for example, solder or a resin bonding agent having a high heat conductivity.

Figure 2:
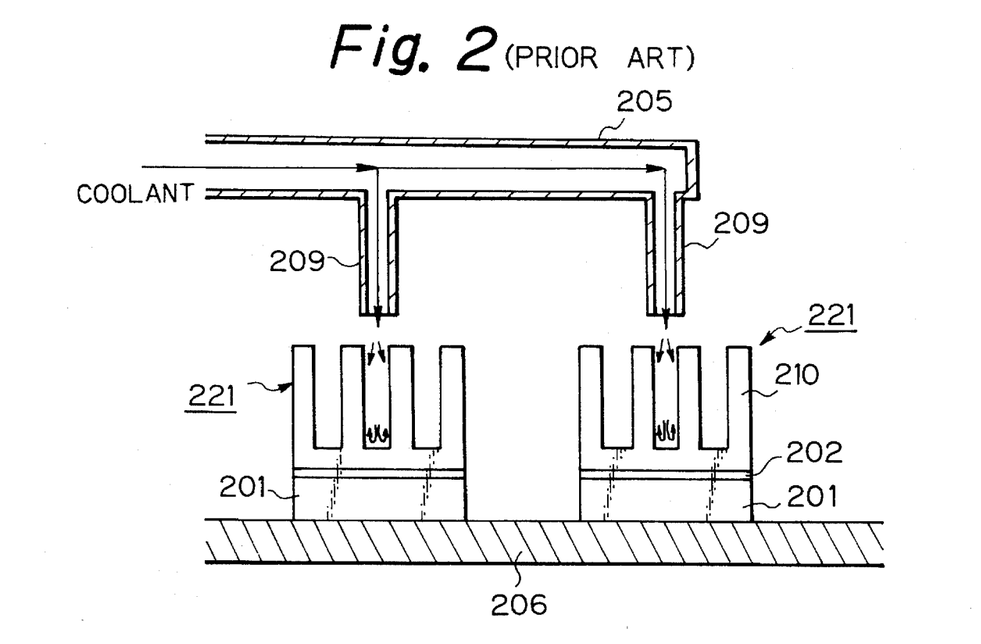
FIG. 2 is a sectional view illustrating an application of the immersion jet cooling method to the integrated circuit chip shown in FIG. 1.

The application of the immersion jet cooling method to an integrated circuit chip 201 to which a heat sink 221 is adhered in this manner is performed in the following manner. As shown in FIG. 2, one or a plurality of integrated circuit chips 201 are disposed on a circuit board 206. A pipe 205 is provided in an opposing relationship to the circuit board 206. Coolant circulates in the inside of the pipe 205, and nozzles 209 for jetting coolant therethrough are provided on the face of the pipe 205 opposing the circuit board 206. The nozzles 209 are disposed at locations corresponding to the integrated circuit chips 201.

An upper end portion of the heat sink 221, that is, an end portion of the heat sink 221 adjacent the pipe 205 is open between adjacent fins 210. Consequently, coolant jetted from the nozzles 209 passes the gaps between the fins 210 and reaches the interior of the gaps in such a manner that it collides with the portions of the heat sinks 221 corresponding to the central portions of the integrated circuit chips 201. The coolant then flows out from the side portions of the fins 210 or the upper ends of the heat sinks 221. An electrically insulating liquid having a low boiling point is normally used as the coolant. Here, the liquid having a low boiling point represents a liquid having a boiling point lower than the surface temperature of the electronic circuit package during operation. Since a liquid having a low boiling point is used as the coolant, part of the coolant that has come in contact with the fins 210 or heat sinks 221 will boil and evaporate, and cooling is performed efficiently by the heat of vaporization.

In the arrangement shown in FIGS. 1 and 2, since the fins 210 are provided, coolant jetted from the nozzles 209 flows as indicated by the arrow marks in FIG. 2 and can remove, at the positions corresponding to the central portions of the integrated circuit chips 201, air bubbles produced on the surfaces of the fins 210 as a result of boiling. However, at peripheral portions of the integrated circuit chips 201, the flow of coolant is obstructed by the fins 210 provided at the central positions, and the cooling efficiency or the cooling rate cannot be enhanced compared with the central portions. Consequently, the surface temperature of each integrated circuit chip 201 will vary between the central portion and peripheral portion of the chip, and a sufficient cooling effect will not always be obtained as a whole.

The necessary amount of coolant increases in proportion to the power dissipation of the integrated circuit chip. Therefore, when the amount of heat generation per unit area increases with a circuit board on which an integrated circuit chip is mounted, the capacity of the coolant supply apparatus and/or the size of the pipe system for coolant must be increased, and the amount of coolant itself must also be increased.

U.S. Pat. No. 4,590,538 to Cray discloses a technique by which a plurality of stacks of circuit modules are arranged in a generally radial pattern to form a columnar aggregate and the aggregate is accommodated in a container to cool the circuit modules by means of coolant. According to the method by Cray, coolant is supplied along the center axis of the column so as to form flows of coolant in radial directions which perform forced cooling of the circuit modules.

When an electronic circuit module is cooled using any of the methods described above, the circuit board and the integrated circuit chip or chips and the heat sink on the circuit board are all immersed in coolant. Consequently, the cooling efficiency is not high. And when the circuit board or the integrated circuit chip or chips must be exchanged, the disassembling and assembling operations are complicated.

SUMMARY OF THE INVENTION

It is an object of the present invention to provide a cooling structure which is superior in cooling efficiency and cooling ability and can cool the entire electronic circuit package uniformly.

The object of the present invention is achieved by a cooling structure for cooling an electronic circuit package using coolant which comprises: a tubular fin member made of a material having high heat conductivity and having a plurality of through-holes of small diameter formed therein; a flat plate member made of a material having high heat conductivity and having a pair of surfaces, one of which is joined to one end of the tubular fin member to close one end of the fin member, the other surface of which is capable of being affixed to the electronic circuit package; a lid member attached to the other end of the tubular fin member; and a pipe member extending through the lid member so that one end thereof is located adjacent the flat plate member, the coolant being supplied through the pipe member by way of the other end of the pipe member.

The object of the present invention is achieved also by a cooling structure for cooling an electronic circuit package using coolant which comprises: a tubular fin member made of a material having high heat conductivity and a plurality of through-holes of small diameter formed therein; a flat plate member made of a material having high heat conductivity and having a pair of surfaces, one of which is joined to one end of the tubular fin member to close one end of the tubular fin member and the other surface is capable of being affixed to the electronic circuit package; a lid member attached to the other end of the tubular fin member and having an opening therein; a coolant supply member provided to supply the coolant and constructed so as to allow the coolant to pass freely through the inside thereof, and a nozzle member mounted on the coolant supply member and inserted into the opening for jetting the coolant into the inside of the tubular fin member.

The above and other objects, features and advantages of the present invention will be apparent from the following description referring to the accompanying drawings which illustrate examples of preferred embodiments of the present invention.

DETAILED DESCRIPTION OF THE PREFERRED EMBODIMENTS

Figure 3:
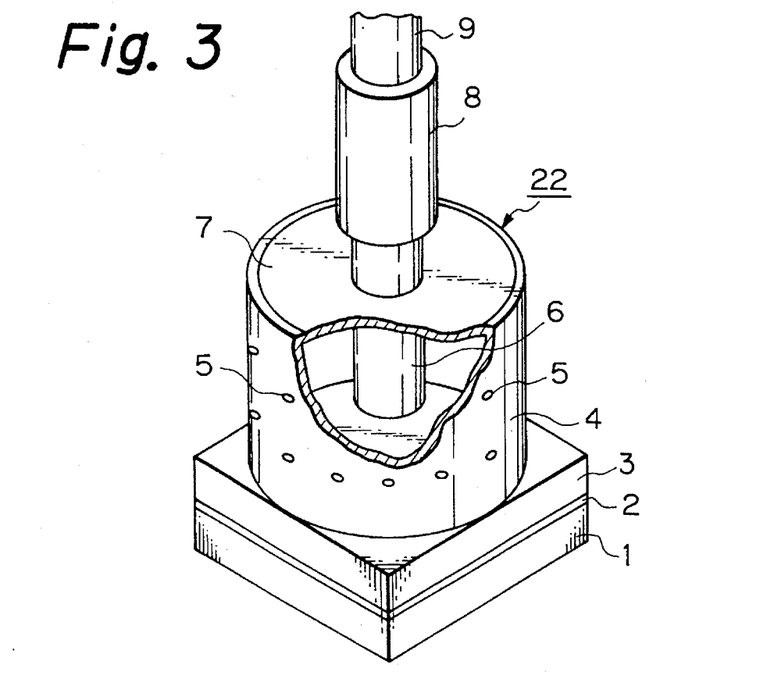
FIG. 3 is a perspective view, partly in section, of a cooling structure of a first embodiment of the present invention.
Figure 4:
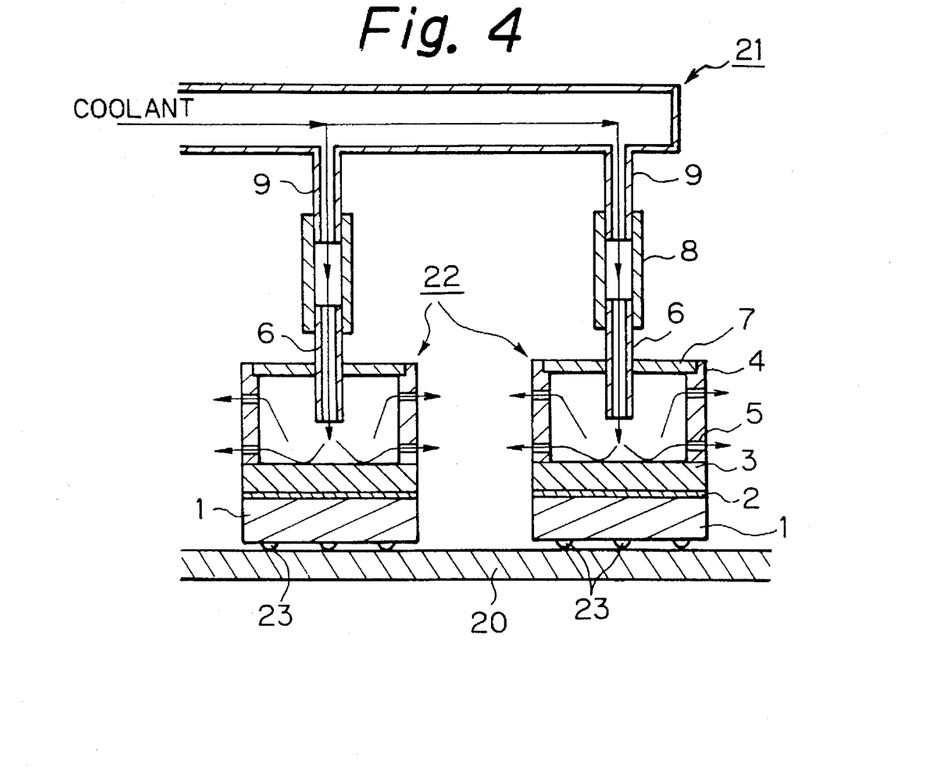
FIG. 4 is a sectional view showing an example of use of the cooling structure shown in FIG. 3.

The first embodiment of the present invention is described with reference to FIGS. 3 and 4. A heat sink 22 is constituted from a substantially rectangular flat plate 3 made of a material having high heat conductivity such as copper or aluminum, a tubular fin 4 made of a material having high heat conductivity, an upper lid 7, and a nozzle 6 extending through the upper lid 7. One end of the tubular fin 4 is secured to a surface of the flat plate 3, and the upper lid 7 is mounted at the other end of the tubular fin 4. A large number of through-holes 5 of small diameter are formed uniformly over the entire area of the tubular fin 4.

An integrated circuit chip 1 is adhered face-down to the other surface of the flat plate 3 by way of a bonding member 2. The bonding member 2 may be, for example, solder, a glassy sealing agent, or a resin bonding agent. A resin bonding agent may contain a suitable filler therein in order to improve heat conductivity.

The nozzle 6 is mounted on the upper lid 7 so that the output end portion of the nozzle may be directed toward the flat plate 3. The input side of the nozzle 6 is connected to a connection pipe 9 by way of a hose 8. The connection pipe 9 is provided to supply coolant to the nozzle 6 therethrough. The hose 8 is formed from a pipe made of a material having high flexibility and high resiliency such as a rubber piping.

The method of cooling integrated circuit chips 1 using heat sinks 22 will next be described with reference to FIG. 4.

A plurality of integrated circuit chips 1 are disposed on a circuit board 20. Wiring patterns are naturally formed on the circuit board 20. Electric connecting portions between the circuit board 20 and the integrated circuit chips 1 are contact portions 23 provided by solder joints or pin coupling. A heat sink 22 is provided for each integrated circuit chip 1.

A coolant supply member 21 for supplying coolant to the heat sinks 22 therethrough is provided. The inside of the supply member 21 is hollow so that coolant may freely pass therethrough. Connection pipes 9 provided for each individual heat sink 22 are all connected to the coolant supply member 21.

A liquid of low boiling point which is chemically stable and electrically insulating such as hydrocarbon halogenide or fluorocarbon, for example "Fluorinert" produced by 3M Company, is employed as the coolant. Coolant supplied into the inside of the coolant supply member 21 advances in the direction indicated by the arrows in FIG. 4 and is supplied into each of the heat sinks 22 by way of the corresponding connection pipes 9 and hoses 8. The coolant is jetted from the nozzle 6 of each heat sink 22 toward the flat plate 3. As a result, the coolant conducts heat away from the integrated circuit chip 1 and flows out to the outside of the heat sinks 22 from the through-holes 5 in the side walls of the tubular fin 4. Here, since the tubular fins 4 have a cylindrical profile, the coolant can contact the entire heat conducting surface of the tubular fin 4.

Since the coolant has a low boiling point and conducts heat away by its own evaporation, in cooling of integrated circuit chip 1 using heat sink 22, the degree to which the coolant contacting the tubular fin 4 boils and conducts heat away from the tubular fin 4 significantly affects the cooling efficiency of the entire system. This type of cooling is based on nucleate boiling. When the temperature of a tubular fin 4 exceeds a particular temperature (burn-out point), which varies depending upon the type of coolant, the form of boiling changes from nucleate boiling to film boiling. In the film boiling region, a vapor film occurs between the tubular fin 4 and the coolant which causes a remarkable reduction in the amount of heat which is conducted away from the tubular fin 4 in the form of heat of vaporization. In order to prevent the occurrence of film boiling, it is necessary to quickly remove small air bubbles produced at the initial stage of boiling from the heat conducting surface of the tubular fin 4. To this end, it is effective to provide a large number of stable bubble generating points. In the heat sink 22 of the present embodiment, since through-holes 5 on the surface of the tubular fin 4 serve as the stable bubbling points, a large number of stable bubble generating points are involved.

Meanwhile, since the upper lid 7 exists at the top of the tubular fin 4, coolant colliding with the flat plate 3 does not flow out from the top of the tubular fin 4 but is forced out through the through-holes 5. Small bubbles generated at the through-holes 5 as described above are quickly discharged from the heat sink 22 together with the bubbles. Accordingly, the growth of bubbles is suppressed and the change from nucleate boiling to film boiling is prevented. Further, since coolant is forced through the through-holes 5, the overall heat conducting area of the heat sink 22 is substantially increased.

Since the connection between each connection pipe 9 connected to the supply member 21 and the nozzle 6 of the corresponding heat sink 22 is established by the hose 8, the nozzle 6 can be disposed corresponding to a central portion of the integrated circuit chip 1 irrespective of the arrangement or the magnitude of the integrated circuit chips 1 on the circuit board 20. Consequently, when a plurality of integrated circuit chips is involved, a certain degree of freedom is provided in the attachment of the cooling apparatus to the integrated circuit chips. The influence of errors in placing the integrated circuit chips is decreased and the assembling operation can be simplified. Also, the stress produced by thermal expansion of the integrated circuit chips by heat generation can be moderated.

Figure 5:
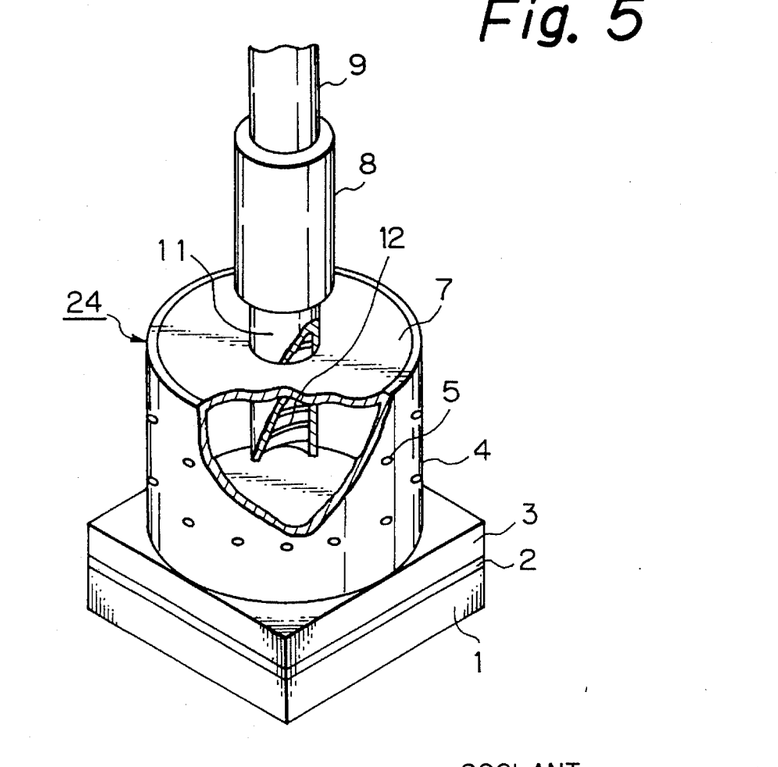
FIG. 5 is a perspective view, partly in section, of a cooling structure of a second embodiment of the present invention.

While the first embodiment is described above, various modifications may be made to the form and the shape of the nozzles. FIG. 5 shows the construction of a heat sink according to a second embodiment of the present invention. In FIG. 5, equivalent elements are denoted by the same reference numerals used in FIGS. 3 and 4.

In the present heat sink 24, a spiral groove 12 is formed on the inner surface of the nozzle 11. Consequently, when coolant passes through the nozzle 11, a whirling movement is imparted to the coolant. The coolant collides with the flat plate 3 while whirling spirally. The effect of the whirling movement is added to the effect of contact between the tubular fin 4 and the coolant, and the efficiency of heat transmission from the tubular fin 4 to the coolant is further promoted.

Figure 6:
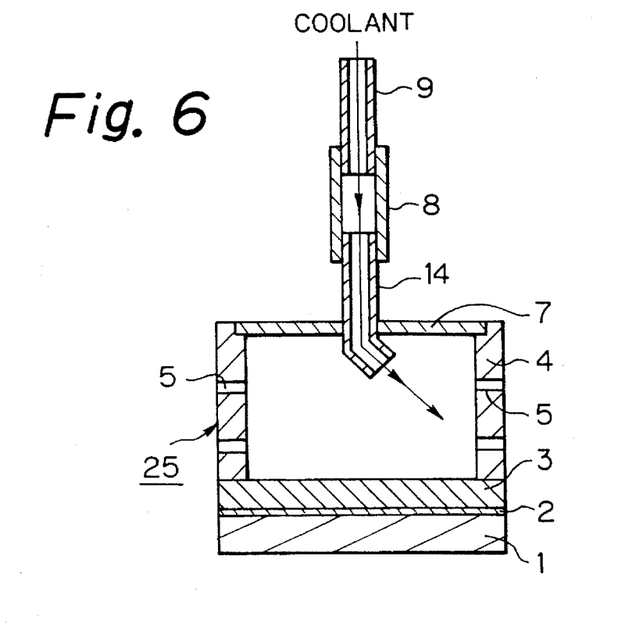
FIG. 6 is a sectional view of a cooling structure of a third embodiment of the present invention.

FIG. 6 shows the construction of a heat sink of a third embodiment of the present invention. In FIG. 6, equivalent elements are denoted by the same reference numerals used in FIGS. 3 and 4.

In the present heat sink 25, a bent tube is employed as the nozzle 14. The output end portion of the nozzle 14 adjacent the heat sink 25 is directed obliquely with respect to the inner wall of the tubular fin 4. Accordingly, coolant jetted from the nozzle 14 collides with the flat plate 3 while whirling along the inner face of the tubular fin 4. As a result, the efficiency of heat transmission from the tubular fin 4 to the coolant is further promoted, similarly to the second embodiment.

Figure 7:
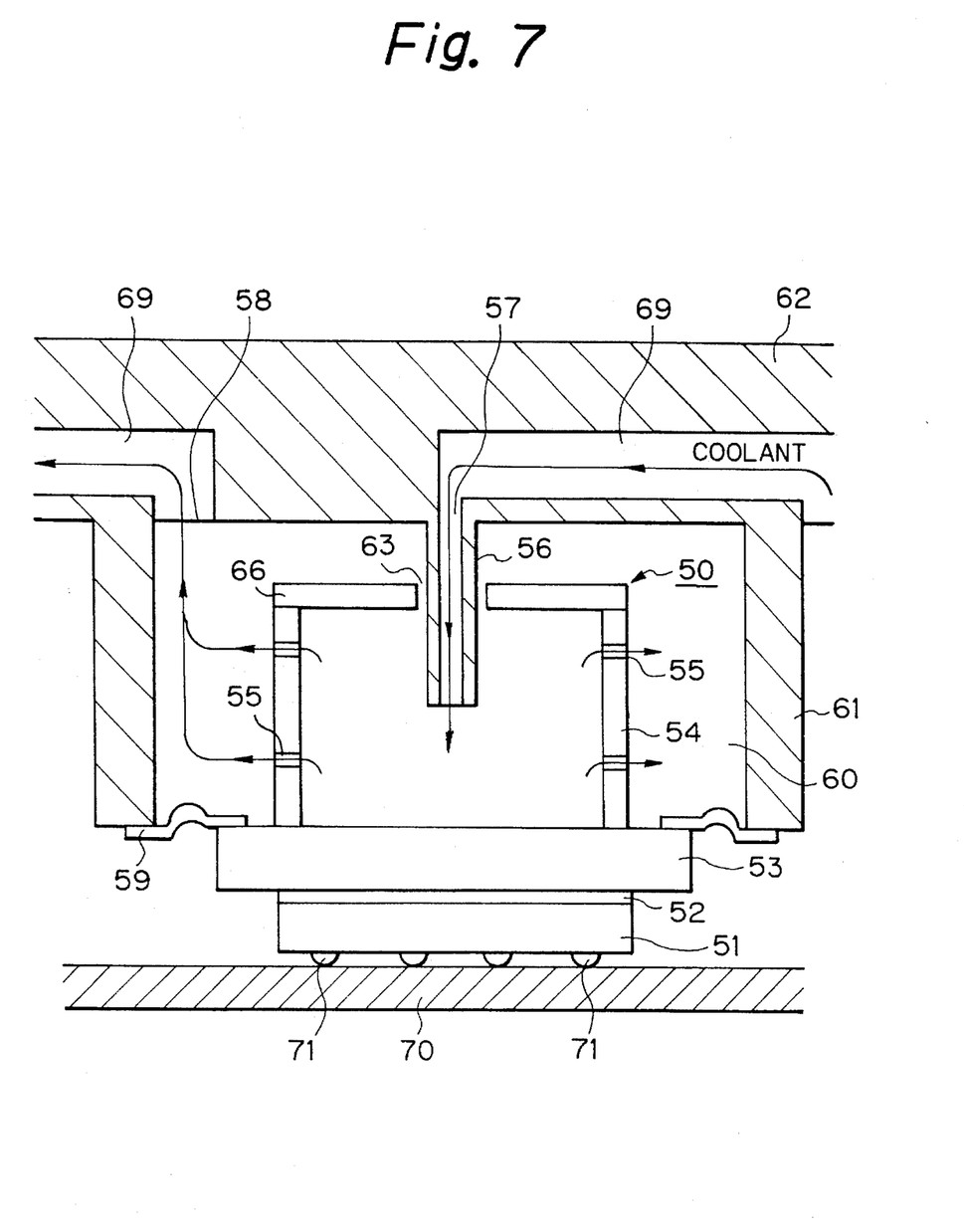
FIG. 7 is a sectional view of a cooling structure of a fourth embodiment of the present invention.

Next, a fourth embodiment of the present invention will be described with reference to FIGS. 7, 8 and 9. The heat sink 50 is constituted from a circular flat plate 53 made of a material having high heat conductivity such as copper or aluminum, a tubular fin 54 similarly made of a material having high heat conductivity, and an upper lid 66 having an opening 63 at a central portion thereof. One end of the fin 54 is secured to one of the surfaces of the flat plate 53, and the upper lid 66 is attached to the other end of the tubular fin 54. A large number of through-holes 55 of small diameter are formed uniformly over the entire area of the tubular fin 54.

An integrated circuit chip 51 is adhered face-down to the other surface of the flat plate 53 by way of a bonding member 52. In particular, the heat radiating surface of the integrated circuit chip 51 is directed toward the flat plate 53. The bonding member 52 may be, for example, solder, a glassy sealing agent or a resin bonding agent. A resin bonding agent may contain a suitable filler to improve heat conductivity. The integrated circuit chip 51 is mounted on the circuit board 70 by way of contact members 71 formed from solder joints or pin joints. Wiring patterns (not shown) are formed on the circuit board 70.

A cold plate 62 made of a material having high heat conductivity is provided in an opposing relationship to the circuit board 70. The cold plate 62 is provided to supply coolant to the heat sink 50 and to retrieve coolant flowing out from the heat sink 50. Passages 69 through which the coolant circulates are formed in the inside of the cold plate 62. Inlet ports 57 and outlet ports 58 are formed on the surface of the cold plate 62 adjacent the circuit board 70 and communicating with the passages 69. A nozzle 56 is connected to each of inlet port 57 and extends to the inside of the heat sink 50 through the opening 63 in the upper lid 66. The end of the nozzle 56 is arranged opposite the flat plate 53.

Cylindrical walls 61 are mounted on the cold plate 62 to surround each tubular fin 54. A thin leaf spring 59 is mounted at the end of the wall 61, and the wall 61 and flat plate 53 are thereby joined by the thin leaf spring 59. Each thin leaf spring 59 is in the shape of a disk with a circular opening. The diameter of the circular opening is smaller than the diameter of the flat plate 53, and the diameter of the thin leaf spring 59 is larger than the inner diameter of the cylindrical wall 61. Accordingly, a cooling bath 60 is formed which is substantially closed by the body of the cold plate 62, the walls 61, the thin leaf spring 59 and the flat plate 53. An outlet port 58 is disposed in the inside of cooling bath 60. The entrance and the exit of cooling bath 60 are provided by the inlet port 57 and outlet port 58, respectively.

In the present embodiment, one cold plate is normally used to cool a plurality of integrated circuit chips 51, and a series of interconnected heat sinks 50 is provided for a number of different integrated circuit chips. To this end, the passage 69 which communicates with one of the inlet ports 57 communicates with a cooling bath on the upstream side. Similarly, the passage 69 which communicates with the outlet port 58 communicates with the downstream inlet port to a cooling bath on the downstream side.

Figure 8:
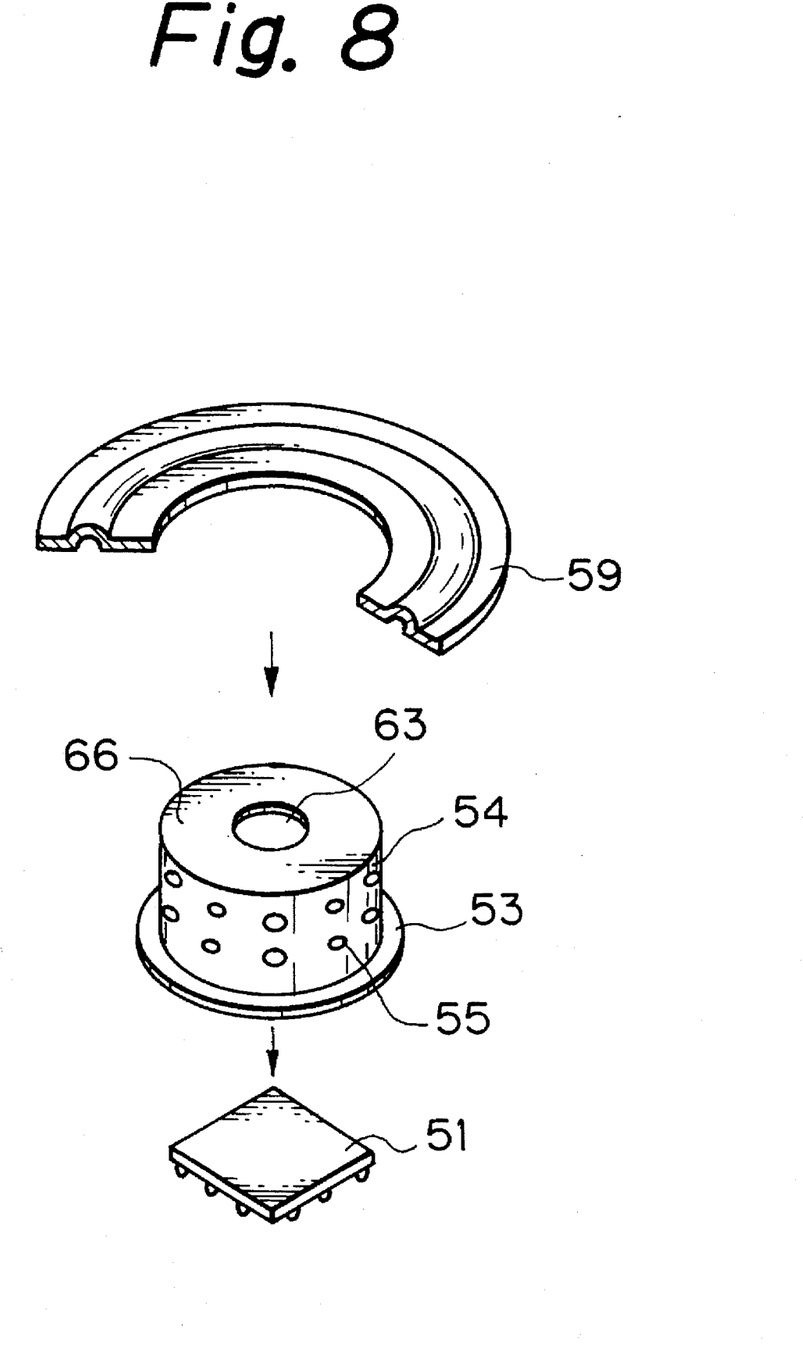
FIG. 8 is a perspective view illustrating the assembly of the cooling structure shown in FIG. 7.

The details of the flat plate 53, including the thin leaf spring 59 and the tubular fin 54 are shown in FIG. 8. The thin leaf spring 59 is in the form of a disk-shaped ring as described above, and the section of the ring has an intermediate curved portion between the inner side and the outer side of the ring. The inner periphery of the ring contacts the flat plate 53 to which the tubular fin 54 is secured, and the outer periphery of the ring contacts the cylindrical wall 61.

The circulation of coolant in the present embodiment will next be described with reference to FIG. 9. A liquid such as fluorocarbon which has a low boiling point and is chemically stable and electrically insulating, is employed as the coolant, similarly to the embodiments described above. In FIG. 9, it is shown that a plurality of integrated circuit chips 51 are linearly disposed on circuit board 70 and a heat sink 50 is provided for each of the integrated circuit chips 51. Cooling baths 60 corresponding to each integrated circuit chips 51 are connected in series with regard to the flow of the coolant.

Figure 9:
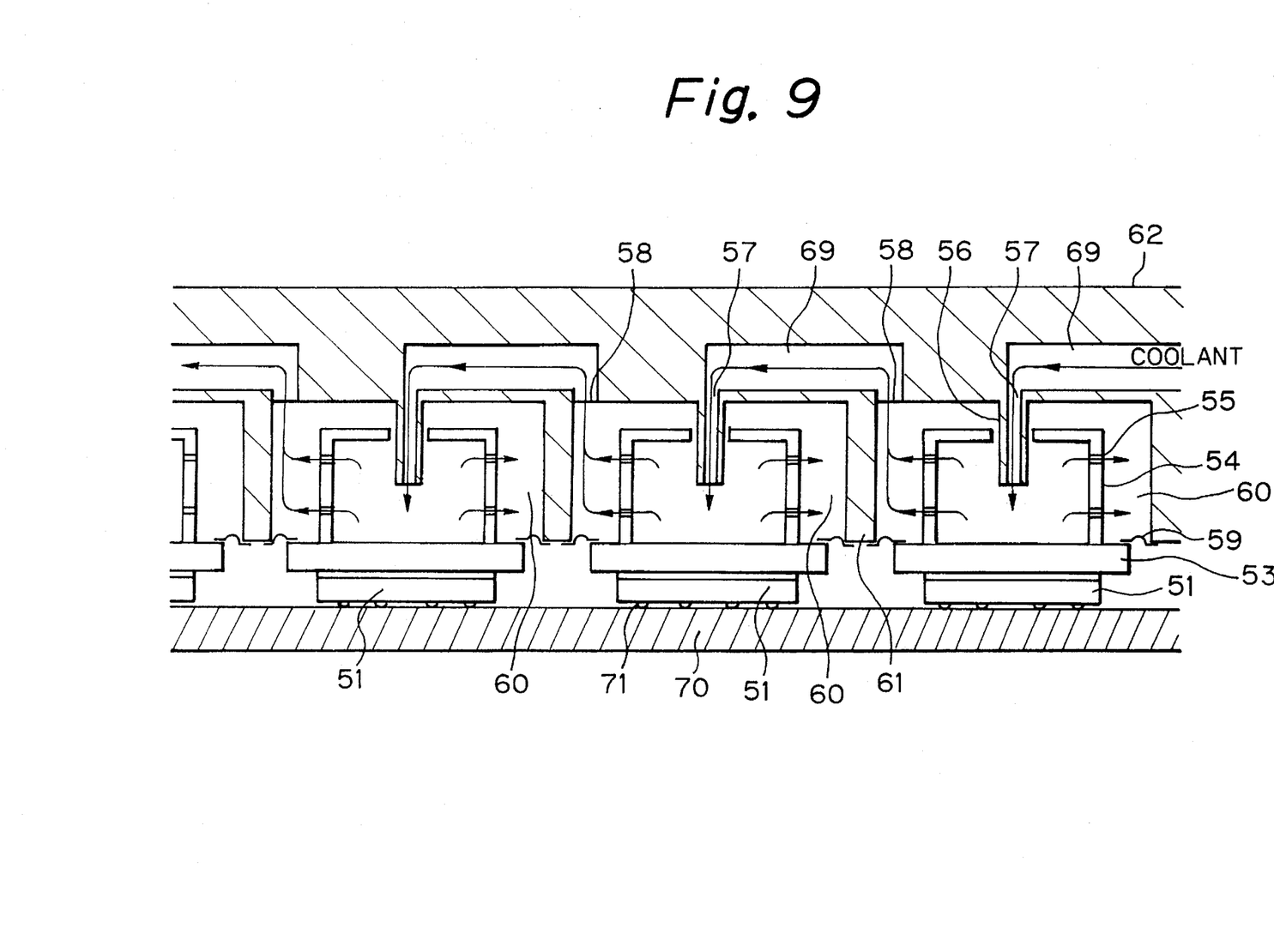
FIG. 9 is a sectional view showing an example of use of the cooling structure shown in FIG. 7.

Coolant advances in the direction indicated by the arrows in FIG. 9. The coolant flows from the inlet port 57 through the nozzle 56 and is jetted into the heat sink 50 corresponding to the integrated circuit chip 51 positioned on the far right of FIG. 9. The jetted coolant collides with the flat plate 53 and then flows out through the through-holes 55 formed in the tubular fin 54 into the space on the outer side of the heat sink 50 inside the cooling bath 60. The coolant then passes through the outlet port 58 and passes by way of the passage 69 to the inlet port of the next cooling bath corresponding to the adjacent integrated circuit chip 51 (the second integrated circuit chip from the right in FIG. 9). The coolant flows through the cooling bath corresponding to the second integrated circuit chip 51 and flows to the inlet port corresponding to the next adjacent, that is, the third, integrated circuit chip 51 from the right in FIG. 9. Thereafter, the coolant successively flows through the cooling baths on the downstream side.

In the present embodiment, since the upper lid 66 is mounted on the tubular fin 54 and the nozzle 56 is inserted through the opening 63 formed in the upper lid 66, coolant jetted from the nozzle 56 flows out after colliding with the flat plate 53 to the outside space of the heat sink 50 through the large number of through-holes 55 of small diameter formed in the tubular fin 54. Accordingly, the transition from nucleate boiling to film boiling is suppressed and the integrated circuit chip 51 can be cooled efficiently, similarly to the embodiments described above.

Since the thin leaf spring 59 is a flexible member having a curved portion, that is, a convex portion or a concave portion, provided at a central portion of the band forming the ring, when mounting to a circuit board 70, any difference in the height and the inclination of integrated circuit chips 51 can be absorbed. This makes it possible to adhere the entire heat radiating surface of the integrated circuit chip 51 to the flat plate 53 with certainty. The thin leaf spring 59 also serves to moderate stress caused by thermal expansion of the integrated circuit chip 51 due to generation of heat.

In the present embodiment, the flat plate 53 and wall 61 are joined by the thin leaf spring 59, and coolant is localized in the cooling bath 60. Neither the integrated circuit chips 51 nor the circuit board 70 comes in contact with the coolant, and accordingly, maintenance procedures are simplified. If the connection between the thin leaf spring 59 and the flat plate 53 or the connection between the thin leaf spring 59 and the wall 61 is broken, the portion which is filled with insulating coolant (a portion of the cooling bath) and the integrated circuit chip can be easily separated. Further, the connection between the cooling bath portion and the integrated circuit chip can be readily reestablished by applying pressure to cause contact through the thin leaf spring 59. Accordingly, assembling or disassembling when mounting an integrated circuit chip is simplified, and replacement of a circuit board or an integrated circuit chip can be performed readily.

Since the cooling bath 60 is surrounded by a cooled cylindrical wall 61, bubbles produced as a result of contact between the coolant and the tubular fin 54 can be cooled readily, and the bubbles in the coolant can be liquefied and rapidly eliminated. As a result, the heat exchanging rate is increased and the cooling efficiency is raised. Further, the increase in pressure caused by production of bubbles can be suppressed.

Figure 10:
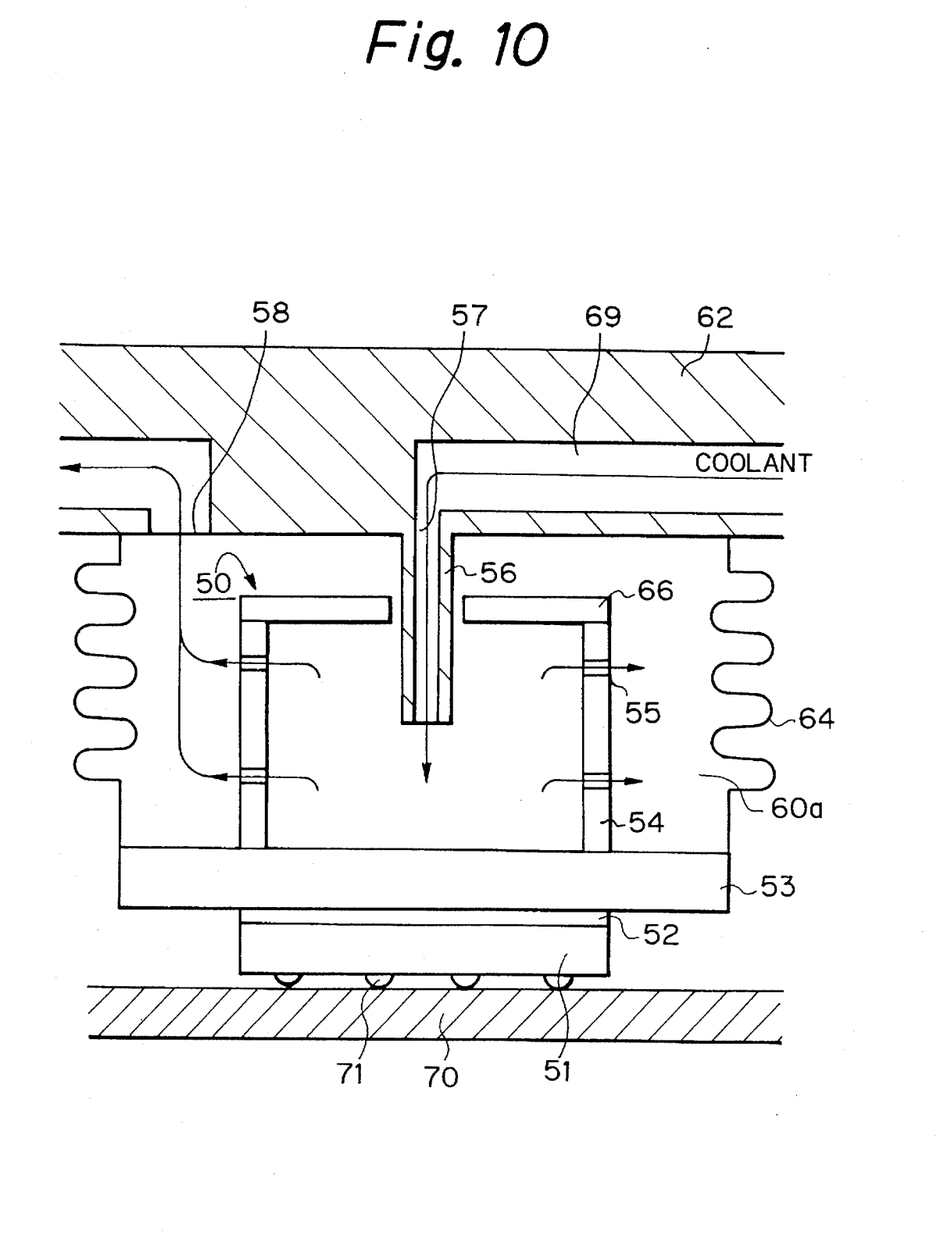
FIG. 10 is a sectional view of a cooling structure of a fifth embodiment of the present invention.

A fifth embodiment of the present invention will next be described with reference to FIG. 10. The present embodiment employs a bellows 64 in place of the thin leaf spring and the cylindrical wall of the fourth embodiment. In FIG. 10, equivalent elements are denoted by the same reference numerals used in FIG. 7.

One end of the bellows 64 is connected to the cold plate 62 while the other end contacts the flat plate 53. The outlet port 58 is disposed on the inner side of the bellows 64. As a result, the cooling bath 60a is formed from the cold plate 62, bellows 64 and flat plate 53. Coolant flows in a similar manner to the fourth embodiment.

In the present invention, the shape of the tubular fin is not limited to a cylindrical shape and may otherwise be a polygonal shape such as a hexagon or an octagon. Further, the present invention is not limited to applications for cooling integrated circuit chips but can be applied to electronic circuit modules of any form such as, for example, power transistors, power diodes or resistor arrays.

It is to be understood that variations and modifications of the cooling structure disclosed herein will be evident to those skilled in the art. It is intended that all such modifications and variations be included within the scope of the appended claims.

What is claimed is:

1. A cooling structure for cooling an electronic circuit package using liquid coolant having a low boiling point which can remove heat by vaporization of said liquid coolant, comprising:

a tubular fin member made of a material having high heat conductivity and having a plurality of through-holes of small diameter formed therein;

a flat plate member made of a material having high heat conductivity and having a pair of surfaces, a first one of said surfaces being joined to one end of said tubular fin member to close one end of said fin member, and a second one of said surfaces being capable of being affixed to the electronic circuit package;

a lid member being attached to the other end of said fin member; and a pipe member extending through said lid member so that an outlet at one end thereof is located adjacent said first surface of said flat plate member;

wherein the liquid coolant being supplied into said pipe member by way of the other end of said pipe member directly collides against said first surface of said flat plate member and is subsequently forced out through said through-holes in an evaporated state.

2. A cooling structure as claimed in claim 1, wherein the electronic circuit package is fixed to said flat plate member by way of a bonding member made of a material having high heat conductivity.

3. A cooling structure as claimed in claim 2, wherein said tubular fin member has a cylindrical profile.

4. A cooling structure as claimed in claim 3, wherein a spiral groove is formed on the inner face of at least the one end portion of said pipe member.

5. A cooling structure as claimed in claim 3, wherein one end portion of said pipe member is directed obliquely with respect to said flat plate member.

6. A cooling structure as claimed in claim 3, wherein the coolant is an electrically insulating liquid.

7. A cooling structure as claimed in claim 2, further comprising a coolant supply member provided to supply the coolant to a plurality of electronic circuit packages and constructed to allow the coolant to circulate in the inside thereof, and wherein the other end of said pipe member is connected to said coolant supply member.

8. A cooling structure as claimed in claim 7, wherein said tubular fin has a cylindrical profile.

9. A cooling structure as claimed in claim 3, further comprising:

a coolant supply member provided to supply the coolant to a plurality of locations adjacent to electronic circuit packages and constructed to allow the coolant to circulate in the inside thereof; and a hose member;

the other end of said pipe member being connected to said coolant supply member by way of said hose member.

10. A cooling structure for use for cooling an electronic circuit package using liquid coolant having a low boiling point which can remove heat by vaporization of said liquid coolant, comprising:

a tubular fin member made of a material having high heat conductivity and having a plurality of through-holes of small diameter formed therein;

a flat plate member made of a material having high heat conductivity and having a pair of surfaces, a first one of said surfaces being joined to one end of said tubular fin member to close one end of said fin member, a second one of said surfaces being capable of being affixed to an electronic circuit package;

a lid member being attached to the other end of said tubular fin member and having an opening therein;

a liquid coolant supply member provided to supply the liquid coolant and constructed to allow the liquid coolant to circulate in the inside thereof; and a nozzle member mounted on said liquid coolant supply member and inserted through said opening for jetting the liquid coolant into the inside of said tubular fin member directly against said first surface of said flat plate member whereby the liquid coolant is subsequently forced out through said through-holes in an evaporated state.

11. A cooling structure as claimed in claim 10, further comprising:

a peripheral wall member mounted on said coolant supply member and surrounding said fin member; and a resilient member provided at an end portion of said peripheral wall member for substantially closing the gap between the end portion of said peripheral wall member and said flat plate member;

said coolant supply member having a recovery passage formed therein for recovering the coolant overflowing into the inside of said peripheral wall member.

12. A cooling structure as claimed in claim 11, wherein said tubular fin member has a cylindrical profile.

13. A cooling structure as claimed in claim 12, wherein a single coolant supply member is provided for a plurality of electronic circuit packages, and the recovery passage corresponding to one of the electronic circuit packages communicates with the nozzle corresponding to an adjacent one of the electronic circuit packages.

14. A cooling structure as claimed in claim 13, wherein the coolant is an electrically insulating liquid.

15. A cooling structure as claimed in claim 10, further comprising:

a bellows member mounted on said coolant supply member and surrounding said fin member, an end portion of said bellows member being secured to said flat plate member so as to substantially close the spacing around said fin member;

said coolant supply member having a recovery passage formed therein for recovering the coolant overflowing into the inside of said bellows member.

16. A cooling structure as claimed in claim 15, wherein said tubular fin member has a cylindrical profile.

17. A cooling structure as claimed in claim 16, wherein a single coolant supply member is provided for a plurality of electronic circuit packages, and the recovery passage corresponding to one of the electronic circuit packages communicates with the nozzle corresponding to an adjacent one of the electronic circuit packages.

18. A cooling structure as claimed in claim 17, wherein the coolant is an electrically insulating liquid having a low boiling point.

19. The cooling structure as claimed in claim 1, wherein said plurality of through-holes are disposed on the entire surface of the tubular fin member.

20. The cooling structure as claimed in claim 10, wherein said plurality of through-holes are disposed on the entire surface of the tubular fin member.

* * * * *